(12) United States Patent
Kajiwara et al.

(10) Patent No.: US 6,667,480 B2
(45) Date of Patent: Dec. 23, 2003

(54) RADIATION IMAGE PICKUP DEVICE AND SYSTEM

(75) Inventors: Kenji Kajiwara, Kanagawa (JP); Eiichi Takami, Kanagawa (JP); Chido Yokokawa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 205 days.

(21) Appl. No.: 09/897,037

(22) Filed: Jul. 3, 2001

(65) Prior Publication Data

US 2002/0011572 A1 Jan. 31, 2002

(30) Foreign Application Priority Data

| Jul. 4, 2000 | (JP) | ................................ 2000-202420 |
| Aug. 3, 2000 | (JP) | ................................ 2000-235627 |
| Jun. 14, 2001 | (JP) | ................................ 2001-180256 |

(51) Int. Cl.⁷ .................................. G01T 1/24
(52) U.S. Cl. ....................... 250/370.01; 250/370.09; 257/659
(58) Field of Search ..................... 250/370.09, 370.01; 257/659, 660

(56) References Cited

U.S. PATENT DOCUMENTS

| 5,777,335 A | 7/1998 | Mochizuki et al. .... 250/370.09 |
| 5,811,790 A | 9/1998 | Endo et al. ............... 250/208.1 |
| 5,889,316 A * | 3/1999 | Strobel et al. .............. 257/659 |
| 5,990,505 A | 11/1999 | Kajiwara .................... 257/291 |
| 5,998,867 A * | 12/1999 | Jensen et al. ............... 257/659 |
| 6,057,552 A * | 5/2000 | Stettner et al. ......... 250/370.09 |
| 6,495,836 B1 | 12/2002 | Hata ..................... 250/370.09 |
| 6,501,062 B2 | 12/2002 | Tashiro .................... 250/208.1 |

FOREIGN PATENT DOCUMENTS

JP 9-152486 6/1997

\* cited by examiner

Primary Examiner—Constantine Hannaher
(74) Attorney, Agent, or Firm—Fitzpatrick, Cella, Harper & Scinto

(57) ABSTRACT

A radiation image pickup device comprises an image pickup element for converting radiation into an electric signal and picking up an image of an object, a circuit substrate electrically connected to the image pickup element and provided with at least either a circuit for controlling the input signal to the image pickup element or a circuit for processing the output signal from the image pickup element, active elements arranged on the circuit substrate and constituting the circuit and radiation shielding members for shielding the active elements from radiation, the radiation shielding members having a surface area smaller than that of the circuit substrate.

19 Claims, 13 Drawing Sheets

RADIATION IMAGE PICKUP DEVICE AND SYSTEM

BACKGROUND OF THE INVENTION

1. Field of the Invention

This invention relates to a radiation image pickup device and a radiation image pickup system for taking a one-dimensional or two-dimensional image of an object that can suitably be used for a medial instrument, a non-destructive tester or the like.

2. Related Background Art

To begin with, an X-ray imaging apparatus will be described below as typical radiation image pickup device for picking up an image of an object obtained by exposing the object to radiation.

With an X-ray imaging apparatus, a visible image of the object is produced by converting the X-ray image picked up by the image pickup element of the apparatus into electric signals. Since X-rays show a high energy level when compared with rays of visible light, the image pickup element cannot absorb all the X-rays irradiated in the X-ray imaging apparatus and hence some X-rays that have been transmitted through the image pickup element can enter one or more than one semiconductor integrated circuits of the peripheral circuits of the image pickup element to make the latter give rise to operation errors.

In view of this problem, U.S. Pat. No. 5,777,335 and Japanese Patent Application Laid-Open No. 9-152486 propose in their specifications and drawings an arrangement of providing an X-ray imaging apparatus with a shielding member typically made of lead for shielding the semiconductor integrated circuits of the apparatus from X-rays.

FIG. 16 of the accompanying drawings schematically illustrates such a known radiation image pickup device. Referring to FIG. 16, there are shown an image pickup element 1, a support 2 for supporting the image pickup element and other members, a circuit substrate 3, a radiation shielding member 4 typically made of lead, semiconductor integrated circuit elements 5, a cabinet 11, a flexible wiring substrate 12 and radiation 13.

Radiation emitted from a radiation source (not shown) is transmitted through an object and enters the radiation image pickup device. The radiation 13 entering the radiation image pickup device contains X-ray information on the object.

The X-rays entering the image pickup element 1 and containing information on the object generates directly or indirectly an electric charge in the element 1, which electric charge can be read out by an electronic circuit as electric signal.

Since X-rays show a high energy level when compared with rays of visible light so that all the X-rays that enter the image pickup element are not completely absorbed by the latter and hence some of the X-rays can be transmitted through the image pickup element 1. Therefore, the shielding member 4 that is typically a plate of lead is arranged at the side (rear side) opposite to the light receiving side of the image pickup element 1 to prevent X-rays from entering the circuit substrate 3 carrying semiconductor integrated circuit elements 5.

With the arrangement of FIG. 16, the image pickup device contains a lead plate 4 having a surface area significantly larger than the circuit substrate 3 to be shielded from X-rays to make the entire device rather heavy. While such a heavy weight may be allowed to a large medical X-ray apparatus for taking an X-ray picture of a standing or lying subject, it cannot meet the requirements of portable radiation image pickup apparatus for use in a doctor consultation room, at the bed side of a patient or in an ambulance, for which the demand has been rising rapidly in recent years.

SUMMARY OF THE INVENTION

In view of the above identified circumstances, it is therefore an object of the present invention to provide a radiation image pickup device and a radiation image pickup system that are lightweight and highly reliable. Another object of the present invention is to provide a radiation image pickup device and a radiation image pickup system that can hardly give rise to operation errors if the peripheral circuits are exposed to radiation.

In an aspect of the invention, the above objects are achieved by providing a radiation image pickup device comprising an image pickup element for converting radiation into an electric signal and picking up an image of an object, a circuit substrate electrically connected to the image pickup element and provided with at least either a circuit for controlling the input signal to the image pickup element or a circuit for processing the output signal from the image pickup element, active elements arranged on the circuit substrate and constituting the circuit and radiation shielding members for shielding the active elements from radiation, the radiation shielding members having a surface area smaller than that of the circuit substrate.

Active elements such as semiconductor integrated circuits mounted on a circuit substrate are mostly arranged in a distributed manner and the gaps separating neighboring elements are not uniform. For example, a semiconductor integrated circuit showing a square profile may have a side as short as several millimeters or as long as several centimeters.

Therefore, according to the invention, the shielding members are made to have a surface area smaller than that of the circuit substrate and arranged in a distributed manner so that each one of them covers a single active element in principle, although some of the shielding members may cover at least several active elements. With this arrangement, it is possible to make the image pickup device lightweight.

Preferably, the radiation shielding members of a radiation image pickup device according to the invention include flat members, each of which is adapted to be commonly used for a plurality of active elements. With such an arrangement, it will be not necessary to use too small shielding members for shielding so many small elements such as discrete semiconductor elements and hence the efficiency of assembling a radiation image pickup device according to the invention will be greatly improved.

Preferably, the radiation shielding members of a radiation image pickup device according to the invention include flat members, each of which is adapted to be used only for a semiconductor integrated circuit element operating as active element and has a surface area greater than the corresponding semiconductor integrated circuit element. For the purpose of the present invention, the term "flat members" may include plate-like, sheet-like and/or film-like ones.

Alternatively, the radiation shielding members of a radiation image pickup device according to the invention may include flat members, each of which is adapted to be used only for a semiconductor integrated circuit element operating as active element and has a surface area equal to or greater than the package of the corresponding semiconductor integrated circuit element.

Still alternatively, the radiation shielding members of a radiation image pickup device according to the invention may include flat members, each of which is adapted to be used only for a semiconductor integrated circuit element operating as active element and has a surface area smaller than the package of the corresponding semiconductor integrated circuit element but greater than the semiconductor chip of the semiconductor integrated circuit element. With such an arrangement, the overall radiation image pickup device according to the invention can be made more lightweight.

Preferably, the radiation shielding members of a radiation image pickup device according to the invention are arranged between the circuit substrate and the image pickup element and separable from the circuit substrate. With such an arrangement, the shielding members can be removed with ease from the device when the device is thrown away as waste.

Preferably, the radiation shielding members of a radiation image pickup device according to the invention are arranged in contact with the circuit substrate.

Preferably, the radiation shielding members of a radiation image pickup device according to the invention are arranged on the side of the circuit substrate opposite to the side where the active elements are mounted.

Alternatively, the radiation shielding members of a radiation image pickup device according to the invention may be arranged on the side of the circuit substrate where the active elements are mounted.

Preferably, the radiation shielding members of a radiation image pickup device according to the invention are formed by means of a solder applied to the circuit substrate.

Preferably, the image pickup element of a radiation image pickup device according to the invention is provided with a scintillator adapted to emit a visible light upon receiving radiation and an photoelectric converter adapted to generate an electric signal upon receiving said visible light.

Alternatively, the image pickup element of a radiation image pickup device according to the invention may be provided with a converter adapted to generate an electric signal upon receiving radiation.

Preferably, the radiation shielding members of a radiation image pickup device according to the invention is so designed as to have a thickness sufficient for blocking the radiation attenuated when transmitted through the image pickup element.

In another aspect of the invention, there is provided a radiation image pickup device comprising an image pickup element for converting radiation into an electric signal and picking up an image of an object and a flexible circuit substrate having semiconductor integrated circuit chips electrically connected to the image pickup element and bent by an angle not smaller than 90° relative to the image pickup plane of the image pickup element, the flexible circuit substrate being provided with radiation shielding members for shielding semiconductor integrated circuit chips from radiation.

Preferably, the radiation shielding members of a radiation image pickup device according to the invention are arranged either on the front surface side or on the rear surface side of the flexible circuit substrate.

Preferably, the flexible circuit substrate of a radiation image pickup device according to the invention is bent in such a way that the semiconductor integrated circuit chips are located on the rear surface of the image pickup element and the radiation shielding members are arranged between the image pickup element and the semiconductor integrated circuit chips.

In still another aspect of the invention, there is provided a radiation image pickup device comprising an image pickup element for converting radiation into an electric signal and picking up an image of an object, a circuit substrate electrically connected to the image pickup element and provided with at least either a circuit for controlling the input signal to the image pickup element or a circuit for processing the output signal from the image pickup element, semiconductor integrated circuit elements arranged on the circuit substrate to constitute the circuit and radiation shielding members for shielding the semiconductor integrated circuit elements from radiation, each of the radiation shielding members being adapted to be used only for a semiconductor integrated circuit element and having a surface area smaller than the package of the corresponding semiconductor integrated circuit element but greater than the semiconductor chip of the semiconductor integrated circuit element.

In still another aspect of the invention, there is provided a radiation image pickup device comprising an image pickup element for converting radiation into an electric signal and picking up an image of an object, a circuit substrate electrically connected to the image pickup element and provided with at least either a circuit for controlling the input signal to the image pickup element or a circuit for processing the output signal from the image pickup element, active elements arranged on the circuit substrate to constitute the circuit and radiation shielding members for shielding the active elements from radiation, the radiation shielding members including a solder layer arranged on the circuit substrate and having a surface area smaller than that of the circuit substrate but greater than the area of the mounted active elements.

Preferably, the radiation shielding members of a radiation image pickup device according to the invention contain at least a metal selected from Pb, Ta, Ba and W or an alloy of any of them.

Preferably, the radiation shielding members of a radiation image pickup device according to the invention contain a plurality of solder balls.

Alternatively, the radiation shielding members of a radiation image pickup device according to the invention may be made of hardened organic resin containing at least a metal selected from Pb, Ta, Ba and W.

Preferably, the radiation shielding members of a radiation image pickup device according to the invention contain powder of a material effective for blocking radiation.

In still another aspect of the invention, there is provided a radiation image pickup system comprising a radiation image pickup device according to the invention and a display for displaying the image picked up by the radiation image pickup device.

DESCRIPTION OF THE PREFERRED EMBODIMENTS

Embodiment 1

Figure 1:
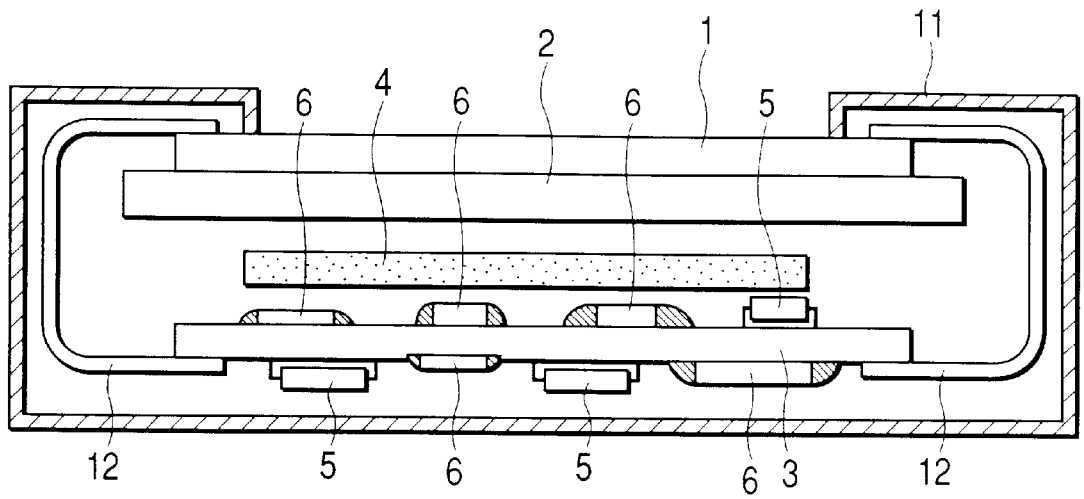
FIG. 1 is a schematic cross sectional view of an embodiment of radiation image pickup device according to the invention, illustrating its configuration.

FIG. 1 is a schematic cross sectional view of the first embodiment of radiation image pickup device according to the invention, illustrating its configuration. Referring to FIG. 1, the embodiment comprises an image pickup element 1, a support 2, a circuit substrate 3, active elements 5, passive elements 6, radiation shielding members 4 for shielding the active elements 5 on the circuit substrate 3 from radiation, a cabinet 11 housing the image pickup element 1 and wiring members 12. The image pickup element 1 may be realized by using either a direct type converter element adapted to generate an electric charge upon absorbing radiation such as X-rays or an indirect type converter element adapted to convert radiation into rays of visible light and then generating an electric charge by absorbing the rays of visible light.

If the image pickup element 1 is of the indirect type, it may comprise a photoelectric converter element formed on a glass substrate by means of a thin film semiconductor process with a wavelength shifter such as a scintillator arranged over the image pickup element 1. With such an arrangement, X-rays are transformed into rays of visible light by shifting the wavelength within the sensitive wavelength range of the photoelectric converter element and the obtained rays of visible light is made to enter the light receiving section of the image pickup element 1 and converted into an electric signal by photoelectric conversion. For example, a radiation image pickup element may be prepared by forming a photoelectric conversion semiconductor layer of the photoelectric converter element from a non-single-crystal semiconductor material such as hydrogenated amorphous silicon (to be referred to as a-Si hereinafter) and a semiconductor layer of thin film field effect transistors (to be referred to as TFTs) simultaneously or sequentially to produce a two-dimensional area type image pickup element for rays of visible light and then bonding a sheet-shaped wavelength shifter typically made of a phosphor such as CsI to the two-dimensional area type image pickup element. For the purpose of the present invention, an indirect type converter element may be prepared by forming a CCD and MOS transistors on a single crystal silicon substrate with photodiodes and then arranging a wavelength shifter on the light receiving surface thereof.

On the other hand, a direct type converter element may be prepared by forming an address circuit by using transistors on the surface of a single crystal silicon substrate or a glass substrate and then connecting the address circuit to a radiation absorption element typically made of a compound semiconductor such as GaAs.

The image pickup element 1 is flatly placed on and rigidly secured to the front surface of the plate-shaped support 2 that is typically made of metal, ceramic or glass. The circuit substrate 3 is rigidly secured at the rear surface side of the support 2 and all the components of the device are housed in the cabinet 11 which is also referred to as cover.

X-rays are made to enter the device from the side of the image pickup element 1 and then subjected to a wavelength shifting process of the plate-shaped scintilltor before entering the image pickup element 1. Then, an electric signal is generated as a result of a photoelectric conversion process of the photoelectric converter element. However, some of the X-rays entering the device can be transmitted through the image pickup element 1 carrying the plate-shaped scintillator without being subjected to a wavelength shifting process so that the circuit substrate 3 arranged at the rear surface side (below in FIG. 1) of the image pickup element 1 can be exposed to the transmitted X-rays.

The circuit substrate 3 may typically be a printed circuit substrate comprising a patterned electrically conductive layer typically made of copper and an insulating layer typically made of glass epoxy. It is possible to highly densely mount circuit elements when the circuit substrate 3 is a multilayer printed wiring substrate formed by alternately laying a number of electrically conductive layers and a number of insulating layers. Typically, a control circuit block for controlling the operation of the image pickup element 1, an image processing circuit block for storing the image signals obtained from the image pickup element 1 and processing the image signals and an interface circuit block operating as interface with the outside are formed in the circuit substrate. The wiring members 12 may be TAB tapes of tape carrier packages having semiconductor integrated circuit chips or simple flexible printed circuit substrates.

The circuits of the circuit substrate 3 include active elements 5 which may be individual semiconductor elements such as individual diodes and individual transistors and/or semiconductor integrated circuit elements and passive elements 6 such as capacitors and resistors and are mounted at least either on the front surface or the rear surface of the circuit substrate 3 along with connectors. Particularly, the active elements 5 that are single crystal semiconductor elements can give rise to operation errors when exposed to X-rays to consequently degrade the quality of the information signal taken therefrom and damage the reliability of the entire device.

Therefore, according to the invention, one or more than one radiation shielding members 4 are arranged at the rear surface side of the glass substrate of the image pickup element 1 between the support 2 and the circuit substrate 3 in such a way that they have a surface area smaller than the image pickup element 1 and also smaller than the circuit substrate 3 as seen from FIG. 1. More specifically, in the case of FIG. 1, a flat X-ray shielding lead plate 4 smaller than the image pickup element 1 is arranged below the image pickup element 1 and the active elements 5 are concentratedly arranged below the lead plate 4 and on the circuit substrate 3 so that the active elements 5 are protected from the transmitted X-rays. The circuit substrate 3 is arranged not around but below the image pickup element 1 as viewed in the direction of projection of X-rays and the active elements 5 are concentratedly arranged in an area of the circuit substrate 3 protected by the lead plate 4.

With such an arrangement, the X-rays transmitted through the image pickup element 1 are blocked by the shielding member 4 so that the active elements 5 on the circuit substrate 3 are prevented from being exposed to X-rays.

Embodiment 2

In this embodiment, the shielding members 4 are arranged at the rear surface side of the image pickup element 1 between the support 2 and the circuit substrate 3 at positions only effective for protecting the active elements 5 arranged on the circuit substrate 3. The passive element 6A is not particularly shielded from X-rays. More specifically, the shielding members 4 are arranged concentratedly above the circuit substrate 3 at the rear surface side of the image pickup element 1 in such a way that each of the shielding members 4 covers a single active element 5. In other words, a plurality of small flat X-ray shielding members 4 are provided. With such an arrangement, the peripheral circuits can be effectively protected against the transmitted X-rays.

Figure 2:
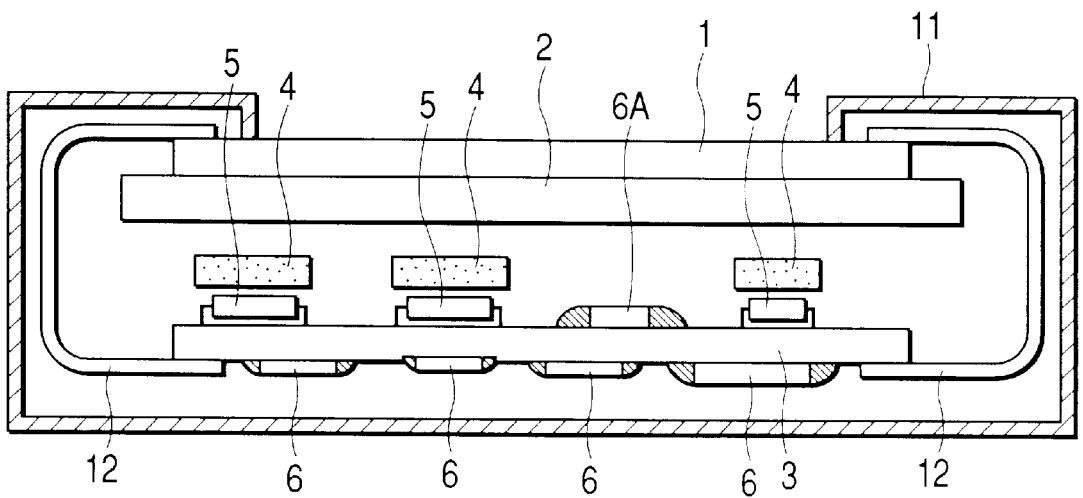
FIG. 2 is a schematic cross sectional view of another embodiment of radiation image pickup device according to the invention, illustrating its configuration.

In the case of the arrangement of FIG. 2, each of the shielding members 4 has a size (in terms of the area disposed vis-a-vis the surface of the circuit substrate 3) slightly greater than the outer profile of the corresponding active element 5. While the circuit substrate 3 carries various circuit elements on the both sides thereof, the active elements 5 are mounted only on one of the surfaces thereof so that the shielding members 4 may be arranged appropriately with ease to properly correspond to the arrangement of the various circuit elements on the circuit substrate 3. The total surface area of the shielding members 4 is smaller than the surface area of the circuit substrate 3. Additionally, the circuit substrate 3 is arranged not around but below the image pickup element 1 as viewed in the direction of projection of X-rays. As described above, small shielding members 4 are arranged at positions corresponding to the respective active elements 5 on the circuit substrate 3. With such an arrangement, the amount of the heavy metal of the X-ray shielding members can be reduced to make the entire device lightweight and downsized because a thin cabinet 11 having a simple profile can be used for the device main body.

The shielding members according to the invention may be modified in various different ways as will be described hereinafter by referring to FIGS. 3A through 3D.

Figure 3A:
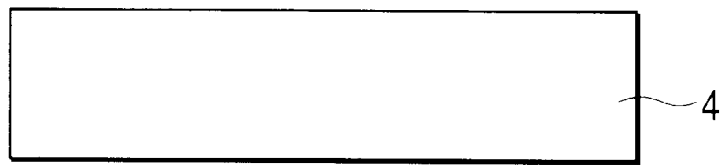
FIGS. 3A, 3B, 3C and 3D are schematic cross sectional views of different shielding members that can be used for the purpose of the present invention.

FIG. 3A shows a shielding member 4 made of a heavy metal or a material containing a heavy metal. As a specific example, it may be made of lead or a lead plate coated on the surfaces thereof with resin.

Figure 3B:
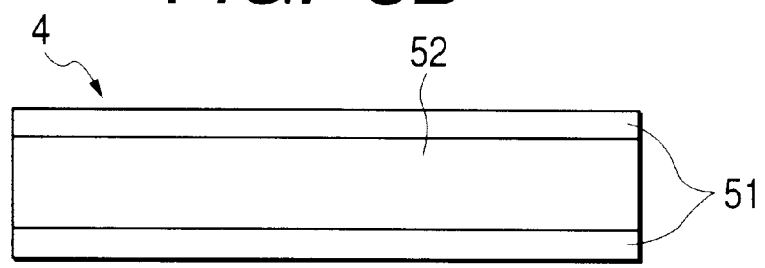

FIG. 3B shows a shielding member 4 comprising a support member 52 having no or little shielding effect and a pair of layers of a shield material 51 sandwiching the support member 52 as integral parts thereof.

Figure 3C:
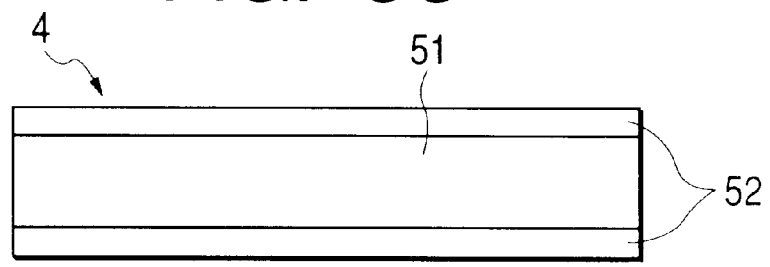

FIG. 3C shows a shielding member 4 comprising a pair of support members 52 and a layer of a shielding material 51 sandwiched by the support members 52.

Figure 3D:
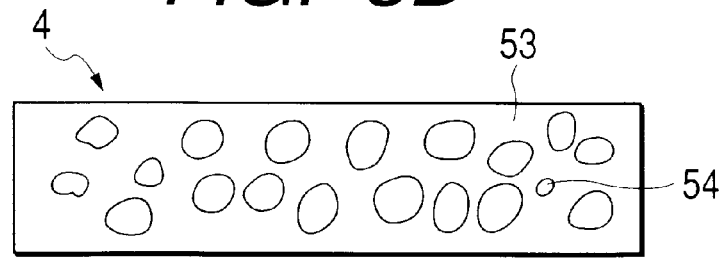

FIG. 3D shows a shielding member 4 obtained by dispersing a large number of small pieces of a shielding material 54 in a block of a binding agent 53.

Figure 4A:
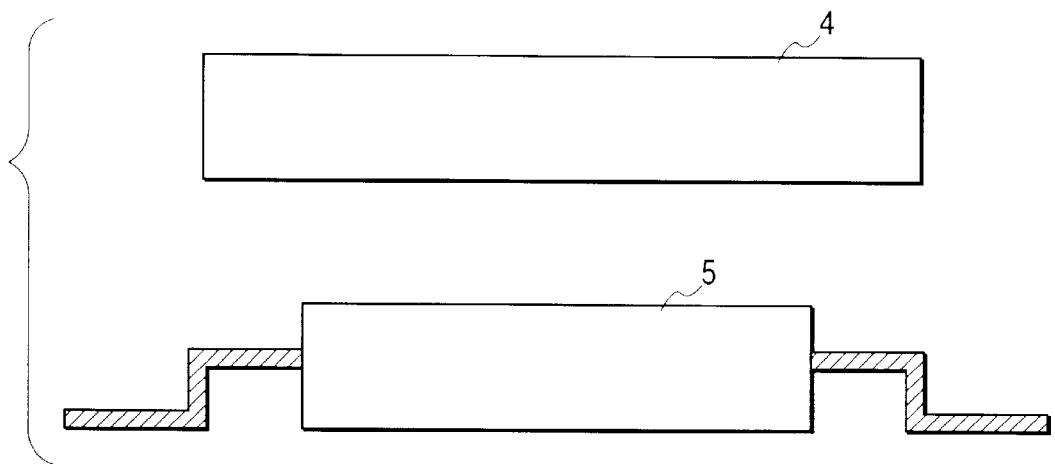
FIGS. 4A and 4B are schematic cross sectional views of a shielding member that can be used for the purpose of the present invention, illustrating how it is arranged in position.
Figure 4B:
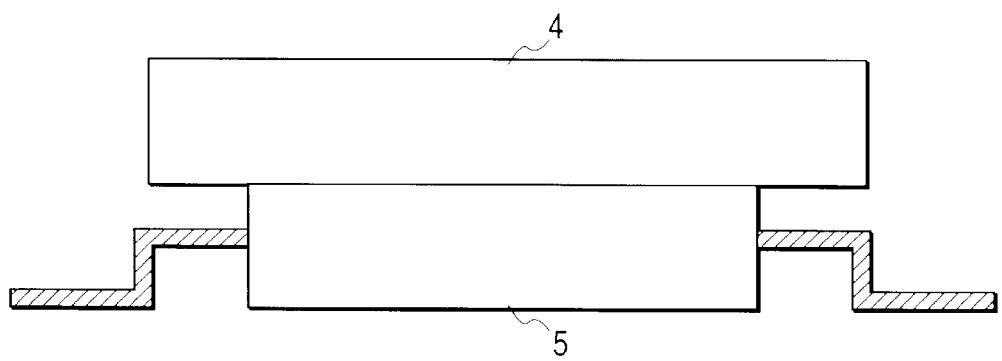

FIGS. 4A and 4B are schematic cross sectional views of a shielding member 4 designed to cover a single active element. If the active element 5 is a semiconductor integrated circuit comprising single crystal semiconductor elements, the shielding member 4 is preferably separated from the package of the semiconductor integrated circuit 5 and rigidly secured to a support member (see FIG. 4A).

Alternatively, the shielding member 4 may be bonded, printed or applied directly onto the active element 5 comprising a semiconductor integrated circuit in order to secure it in position. In FIG. 4B, a shielding member 4 slightly larger than the corresponding package of the semiconductor integrated circuit is rigidly fitted to the package.

Thus, according to the invention, small shielding members can be rigidly secured to respective supporting members or the corresponding active elements by a double adhesive tape or some other simple means to reduce the overall cost of manufacturing a radiation image pickup device.

Embodiment 3

In this embodiment, each of the radiation shielding members for shielding the active elements 5 that are semiconductor integrated circuits from incident radiation is arranged to cover a single semiconductor integrated circuit. The radiation shielding member has a surface area smaller than the corresponding package of the semiconductor integrated circuit element and larger than the semiconductor integrated circuit chip of the semiconductor integrated circuit element.

Figure 5A:
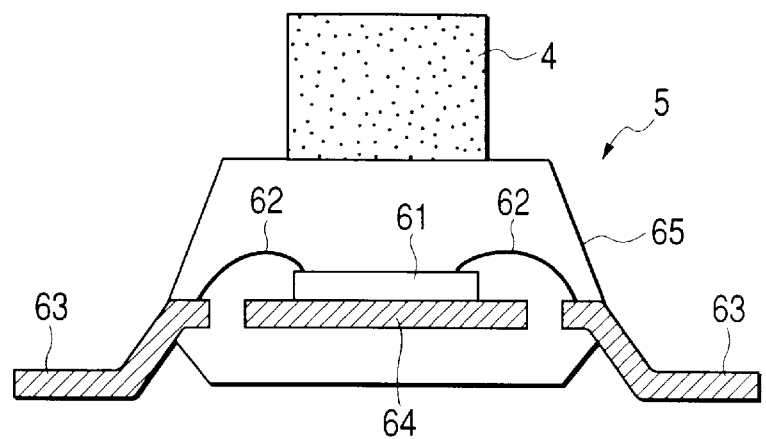
FIGS. 5A and 5B are schematic cross sectional views of still another shielding member that can be used for the purpose of the present invention.

FIG. 5A shows a schematic cross sectional view of a semiconductor integrated circuit element to be mounted on the circuit substrate of an embodiment of image pickup device according to the invention.

Referring to FIG. 5A, the semiconductor integrated circuit element comprises a semiconductor integrated circuit chip 61 typically formed by using a silicon substrate, gold wires 62 operating as bonding wires, lead wires 63 to be connected to external circuits, a frame 64 for supporting the chip 61 and a package 65 typically made of sealing resin.

In the semiconductor integrated circuit element 5, the semiconductor integrated circuit chip 61 is normally significantly smaller than the package 65 that defines the outer profile of the semiconductor integrated circuit element 5 as will be seen from FIG. 5A. Therefore, the shielding member 4 is made to have a mounting area (the area of the mounting surface of the circuit substrate 3 occupied by the shielding member 4) smaller than the mounting area of the package 65 but equal to or larger than the area of the semiconductor integrated circuit chip 61. However, in the case of certain large scale semiconductor integrated circuit elements such as logic circuits and system LSIs, the chip may have an extremely small area if compared with the package. If such is the case, the amount of the shielding material used for the shielding member may be significantly reduced.

Figure 5B:
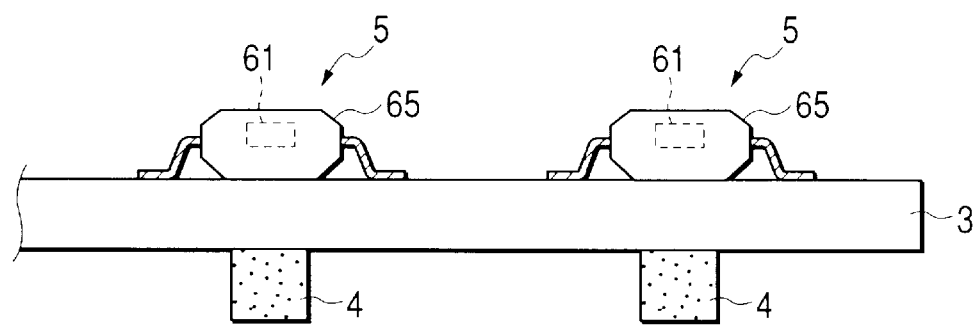

FIG. 5B shows a modified arrangement of the shielding member 4, where the shielding member 4 is arranged on one of the surfaces of the circuit substrate 3 and the corresponding semiconductor integrated circuit element 5 is arranged on the other surface. Note that the shielding member 4 is arranged to face incoming radiation in the device.

Each semiconductor integrated circuit chip may be provided with a pair of shielding members arranged at the opposite sides thereof as a combined embodiment of FIGS. 5A and 5B.

Embodiment 4

In this embodiment of radiation image pickup device, a shielding layer of solder is provided to cover the circuit substrate as radiation shielding member.

Figure 6:
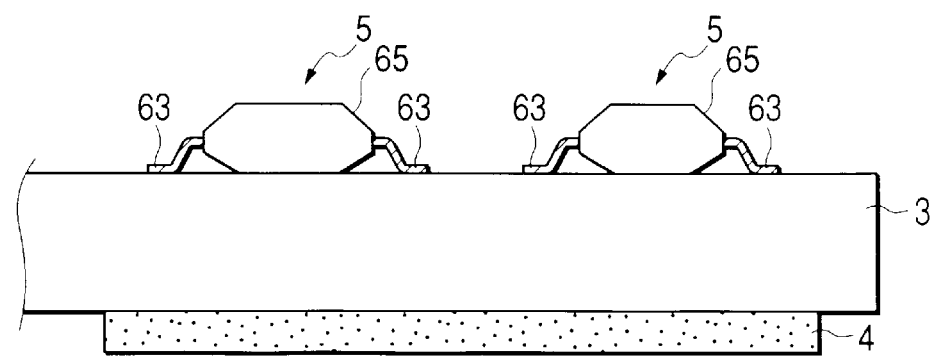
FIG. 6 is a schematic cross sectional view of still another shielding member that can be used for the purpose of the present invention.

FIG. 6 is a schematic cross sectional view of the circuit substrate of this embodiment of radiation image pickup device and the shielding member 4 made of solder containing lead and tin.

The solder layer 4 has an area covering the surface of the circuit substrate 3 smaller than the surface area of the circuit substrate 3 but larger than the mounting area of the active elements 5 of the device.

Embodiment 5

Figure 7:
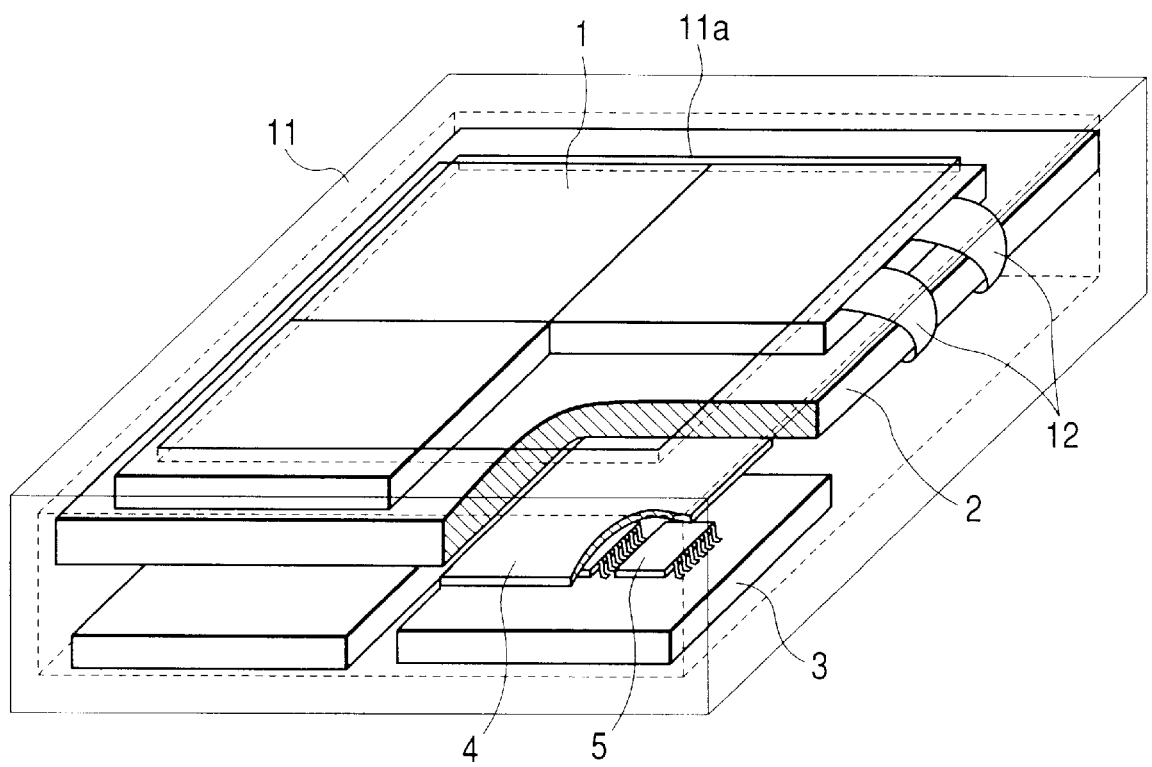
FIG. 7 is a schematic perspective view of still another embodiment of radiation image pickup device according to the invention.

FIG. 7 is a schematic perspective view of Embodiment 5 of radiation image pickup device according to the invention. As seen from FIG. 7, this embodiment comprises a single X-ray shielding member 4 that is smaller than the photoelectric conversion substrates of the image pickup element 1 and designed to cover only a necessary area above the circuit substrate 3.

More specifically, the image pickup element 1 comprises a plurality of (four in FIG. 7) photoelectric conversion substrates and is arranged on the support 2. On the other hand, a plurality of active elements 5 are arranged below the image pickup element 1 and on the circuit substrate 3 that is located on the bottom side of the cover 11 operating as cabinet. A lead plate 4 is arranged as X-ray shielding member between the image pickup element 1 and the circuit substrate 3 at a position corresponding at least to the active elements 5. Electric signals from the photoelectric converter element (not shown) on the photoelectric conversion substrates are transmitted to the side of the circuit substrate 3 by way of wiring members 12 that may be flexible circuit substrates. The cover 11 is provided at the top thereof with an opening 11a that corresponds to the X-ray irradiation area of the device. While a total of four photoelectric conversion substrates 1 are arranged on the support 2 in this embodiment, they may be replaced by a single photoelectric conversion substrate 1 to realize a simple configuration.

In each of the above described embodiments, various components may be fitted to the circuit substrate 3 by means of lead-free solder and only the shielding member(s) may be made of lead. With such an arrangement, a device that has turned to be inoperable can be disassembled and repaired or disposed as waste simply by removing the shielding member (s). Preferably, the shielding member(s) containing lead may be sealed by resin or some other appropriate material.

Embodiment 6

Before describing the sixth embodiment of radiation image pickup device, the entire configuration of a radiation image pickup device will be described by referring to FIGS. 8 through 10.

Figure 8:
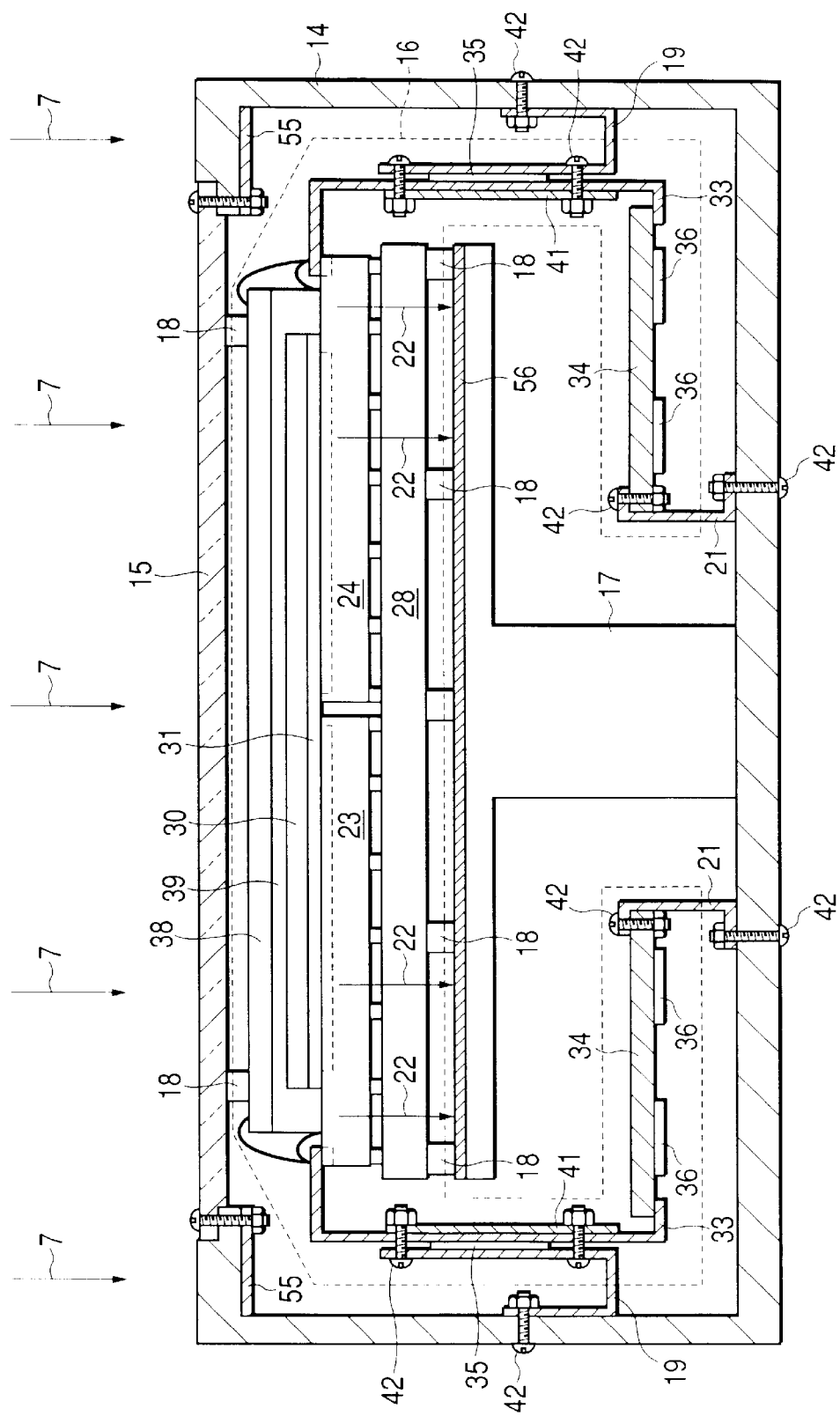
FIG. 8 is a schematic cross sectional view of still another embodiment of radiation image pickup device according to the invention, illustrating its configuration.

FIG. 8 is a schematic cross sectional view of an image pickup device cassette. The outer frame of the cassette is formed by securing a grid 15 to a cabinet 14 by means of screws. The part enclosed by dotted lines 16 in the cassette is a radiation image pickup element module 16. The radiation image pickup element module 16 is supported by a support 17 in the cassette and rigidly secured to the support 17 and the grid 15 by means of anchor members 18 provided with adhesive at opposite ends thereof. The flexible circuit substrate 33 in the radiation solid-state image pickup section 16 of the module is rigidly secured to a heat radiation board 19 by pinching it by the radiation board 19 and a flat board 41 and reducing the gap between the two boards by means of screws 42.

The heat radiation board 19 is linked to the cabinet 14 by means of screws 42 and mechanically secured to the latter. At the same time, the heat emitted from the video signal reading IC 35 mounted on the flexible circuit substrate 33 is lead to the cabinet by way of the radiation board 19 so that the heat may be emitted through a large radiation area to realize a high cooling efficiency.

The printed circuit substrate 34 of the device is rigidly secured to the cabinet 14 by way of a fitting plate 21 and screws 42. In FIG. 8, reference numerals 55 and 56 denote lead plates and reference numeral 22 denotes X-rays that have not been converted by the scintillator and transmitted through the base 28.

Figure 9:
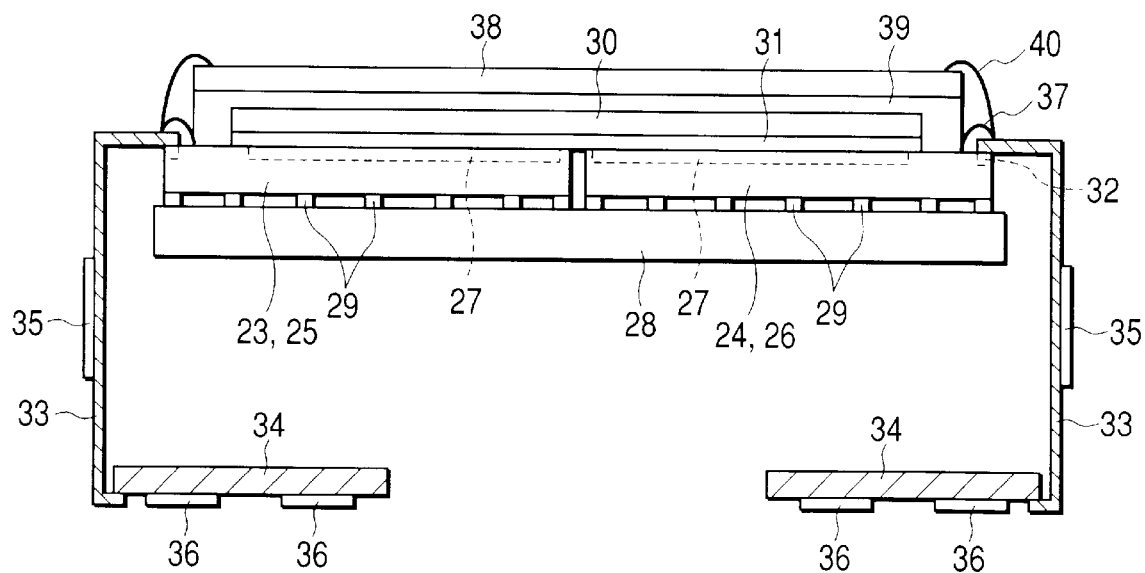
FIG. 9 is a schematic lateral view of the image pickup element module of the embodiment of FIG. 8.
Figure 10:
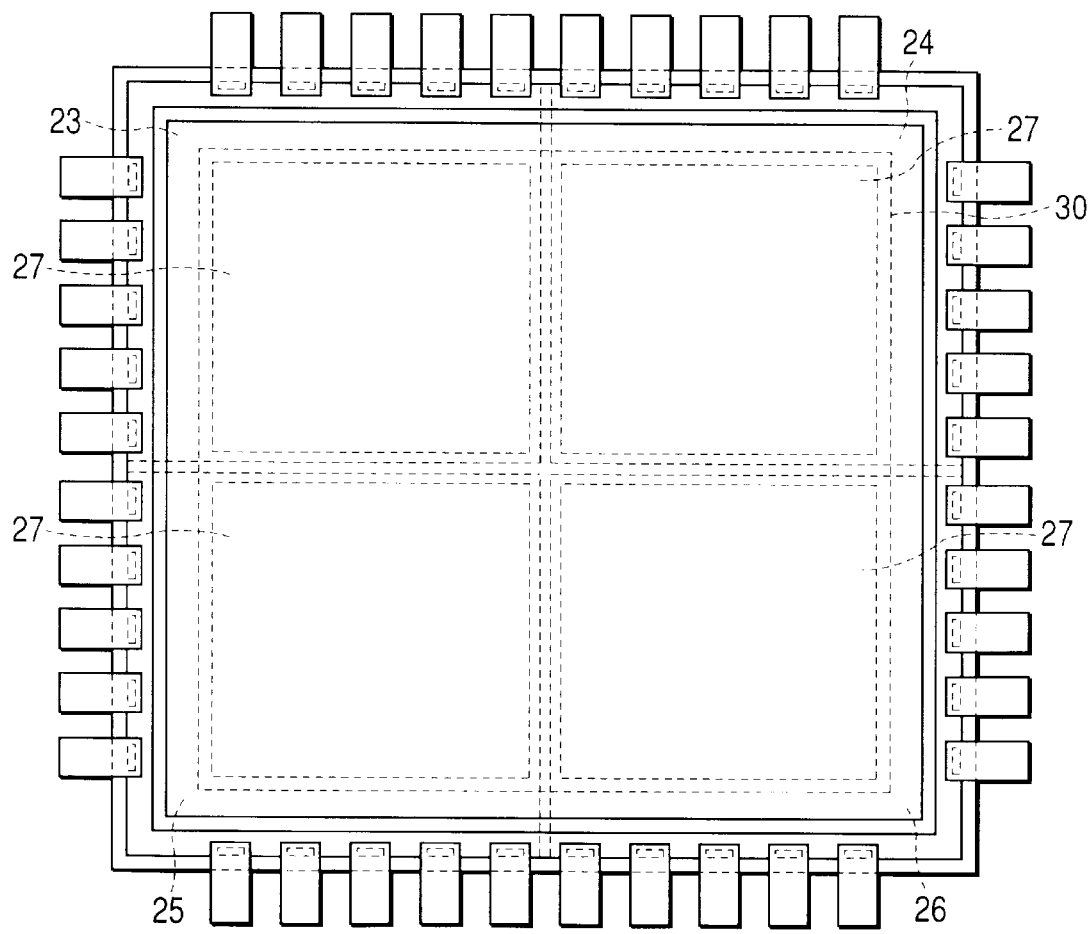
FIG. 10 is a schematic plan view of the image pickup element module of the embodiment of FIG. 8.

FIG. 9 is a schematic cross sectional view of the radiation image pickup element module 16. FIG. 10 is a plan view of the radiation image pickup element module 16. In FIGS. 8, 9 and 10 reference numerals 23 through 26 denote respective sensor base members operating as light receiving sections of the device while reference numeral 27 denotes the pixel regions formed on the sensor base members 23 through 26 comprising photoelectric converter elements and TFT elements (transistors). Reference numeral 28 denotes a base for securely holding the sensor base members 23 through 26 and reference numeral 29 denotes the adhesive bonding the sensor base members 23 through 26 and the base 28 to each other.

The sensor base members 23 through 26 are two-dimensionally aligned to each other in such a way that the pixels thereof are arranged at a same pitch and then rigidly secured to the base 28. This arrangement is advantageous when a plurality of small substrates that can be manufactured at a high yield are combined to produce a large substrate. In other words, a radiation solid-state image pickup element can be realized without using a base 28 when a single large substrate can be manufactured at a high yield.

Reference numeral 30 denotes a plate-shaped scintillator for converting radiation into rays of visible light, which is prepared by applying a granular phosphor such as $CaWO_4$, $Gd_2O_2S:Tb_3$ to a resin plate. Reference numeral 31 denotes the adhesive bonding the sensor base members 23 through 26 to the plate-shaped scintillator 30. Reference numeral 32 denotes a drawing out electrode section to be used for exchanging input signals for driving the photoelectric converter elements and the TFT elements in the pixel regions and output signals representing the read out X-ray information with an input or output system located outside the sensor base members 23 through 26.

While the conversion means of the device comprises the plate-shaped scintillator 30 and the photoelectric converter elements, the use of the plate-shaped scintilltor 30 is not necessary when a conversion means adapted to directly convert radiation into an electric signal is used.

The drawing out electrode section 32 is connected to the printed circuit substrate 34 by way of the flexible circuit substrate 33. The flexible circuit substrate 33 and the printed circuit substrate 34 are provided respectively with ICs 35 and 36 for processing input signals or output signals. A sealing material 37 such as silicone resin, acrylic resin or epoxy resin is provided at the junction of the drawing out electrode section 32 and the flexible circuit substrate 33 in order to protect the drawing out electrode section 32 from electrolytic corrosion.

Reference numeral 38 denotes a metal film adapted to shut off moisture and transmit radiation. The metal film 28 is connected via the adhesive 39 to the plate-shaped scintillator 30. The metal film 38 is used to hermetically seal the plate-shaped scintillator 30, the photoelectric converter elements and the TFT elements when the photoelectric converter elements and the TFT elements need to be shielded from moisture and/or electromagnetic waves. Preferably, the gaps separating the sensor base members 23 through 26 from the metal film 38 is filled with a sealing material 40.

The radiation image pickup device having the above described configuration converts the radiation 7 that has been emitted from a radiation source and transmitted through an object and is entering the cassette into visible light. The obtained visible light is then transmitted through the adhesive 31 arranged right under the plate-shaped scintillator 30 and enters the photoelectric converter element 27 formed on the sensor base members.

The photoelectric converter element converts the visible light into an electric signal representing a two-dimensional image and outputs the electric signal. At this time, it is desirable that the plate-shaped scintillator 30 converts all the radiation 7 into visible light. However, in reality, part of the radiation 7 that has not been converted is transmitted through the sensor base members and the base 28 to irradiate the lead plate 56 arranged on the support 17.

If the lead plate 56 were not provided, the radiation 22 would be transmitted through the support 17 and enter the ICs 36 mounted on the printed circuit substrate 34 located therebelow. The X-rays irradiating the ICs 36 can give rise to operation errors on part of the ICs 36, which by turn can end up with problems that degrade the performance of the photoelectric converter element.

Therefore, known radiation solid-state image pickup devices are provided with a lead plate 56 that protects the ICs 36 on the printed circuit substrate 34 from radiation. Then, as described earlier, the total weight of the device will be very heavy mainly due to the lead plate 56.

Now, Embodiment 6 will be described by referring to FIGS. 11, 12 and 12A.

Figure 11:
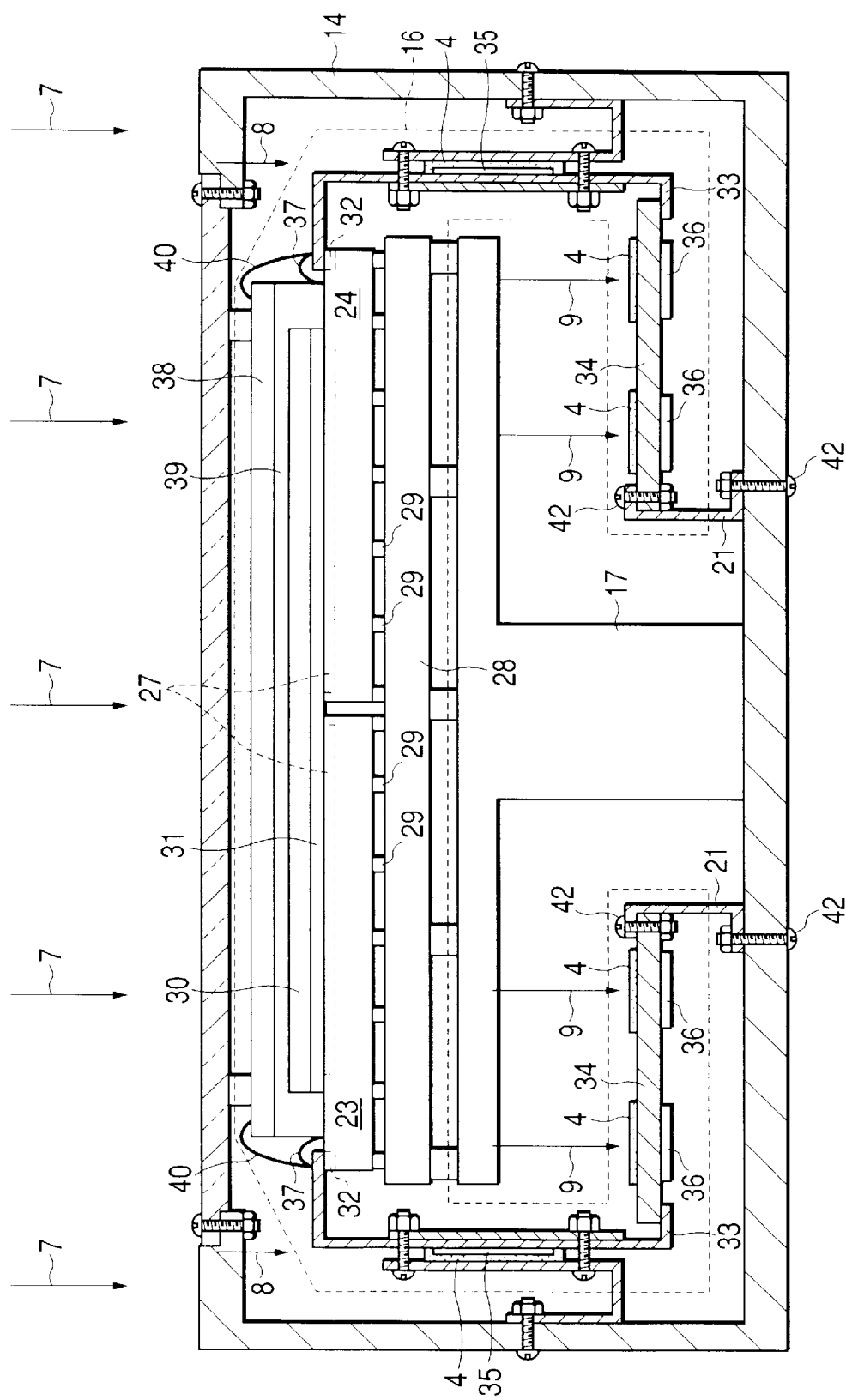
FIG. 11 is a schematic cross sectional view of still another embodiment of radiation image pickup device according to the invention, also illustrating its configuration.

FIG. 11 is a schematic cross sectional view of Embodiment 6 of radiation image pickup device according to the invention. In FIG. 11, the radiation shielding members 4 of this embodiment are made of an organic compound or an inorganic compound mixed with a powdery material that is effective for blocking radiation. The radiation 9 that has not been converted into visible light by the plate-shaped scintillator 30 is then transmitted through the image pickup element module 16 and the support 17 to irradiate the ICs (active elements) 36 arranged on the printed circuit substrate 34.

The radiation shielding members 4 are arranged on the printed circuit substrate 34 in order to block radiation 9. The radiation shielding members 4 are arranged on the surface of the circuit substrate 34 opposite to the surface carrying the ICs 36 with a surface area equal to or greater than the area where the ICs 36 are mounted.

In this embodiment, radiation shielding members 4 are also formed to surround the respective ICs 35 arranged on the flexible circuit substrate 33 that is bent by 90° so that the radiation 8 transmitted through the cabinet 14 may not irradiate the ICs 35. Theoretically, each of the radiation shielding members 4 is required to be arranged only in an area through which radiation 8 might enter if a radiation shielding member 4 were not provided there. In other words, the radiation shielding member 4 is required to cover only the lateral sides of the corresponding IC 35. However, in view of the fact that the flexible circuit substrate 33 may be anchored in position to take a slightly inclined posture depending on how screws 42 are driven into the fitting plate 21, it is better to make the radiation shielding member 4 to totally surround the IC 35 so that the latter may be completely shielded from radiation 4. Note that, in FIG. 11, the components similar to those of FIGS. 8 through 10 are denoted respectively by the same reference symbols.

Figure 12:
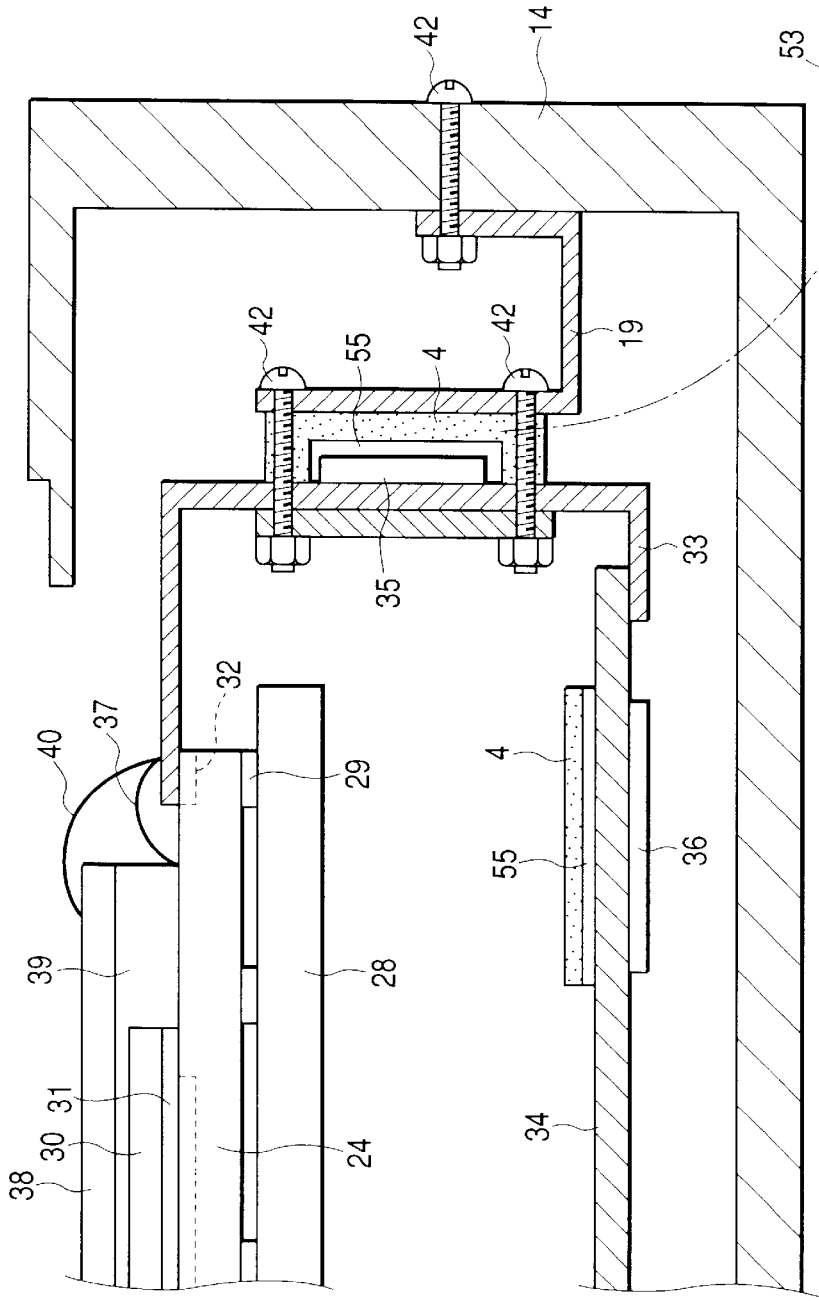
FIG. 12 and FIG. 12A show an enlarged schematic view of the drawing out electrode section and the flexible circuit substrate with related elements of the embodiment of FIG. 11.
Figure 12A:
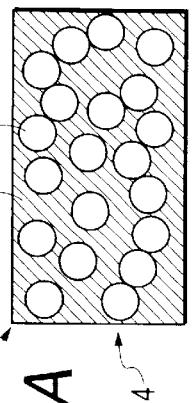

FIGS. 12 and 12A show an enlarged schematic view of the drawing out electrode section 32 of the sensor base member and the flexible circuit substrate 33 with related elements. In FIGS. 12 and 12A, reference numeral 55 denotes an insulating film that is provided whenever necessary and arranged under the corresponding radiation shielding members 4. The use of such an insulating film is advantageous when parts and wires that are not insulated nor protected are arranged in areas that need to be shielded from radiation.

In FIG. 12A, reference numeral 54 denotes a material effective for blocking radiation, which may be a metal selected from Pb, Ta, Ba and W. In practice, it is preferably provided as solder balls because solder can be processed easily to take a granular form. Reference numeral 53 denotes a binding agent of an organic or inorganic compound selected from silicone resin, epoxy resin, acrylic resin, polyurethane resin, alumina and silicon carbide, of which the use of silicone resin, epoxy resin, acrylic resin or polyurethane resin is advantageous because it can be arranged on the ICs 35 and 36 as film covering the latter.

The solder to be used for the solder balls may be an eutectic solder of Sn—Pb (63 wt %:37 wt %) or a high melting point solder of Sn—Pb (10 wt %:90 wt %).

It is also possible to apply the material of the radiation shielding members 4 in a liquid state to the necessary areas by means of a dispenser or a sprayer, typically by flexography, and subsequently harden the material by means of heat, two-pot reaction, moisture or ultraviolet rays. Additionally, the material of the radiation shielding members 4 is preferably made of a material that remains soft when applied to the flexible circuit substrate 33 that can change its profile. The use of silicone resin is most appropriate from this point of view.

If each IC 35 or 36 is covered completely by a corresponding shielding member, it can be shielded from radiation regardless of the angle with which it is irradiated.

Embodiment 7

Figure 13:
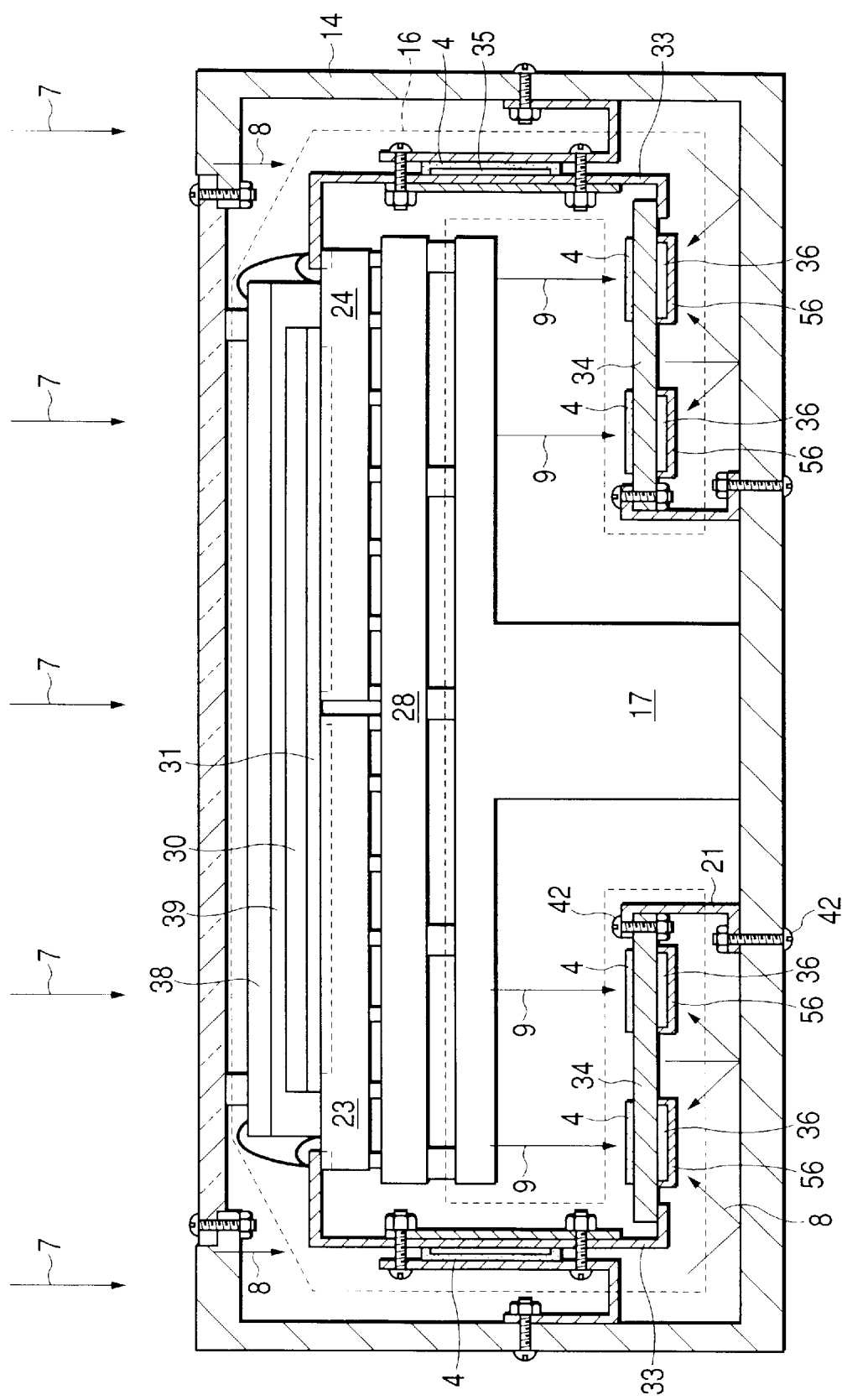
FIG. 13 is a schematic cross sectional view of still another embodiment of radiation image pickup device according to the invention, illustrating its configuration.

FIG. 13 is a schematic cross sectional view of the seventh embodiment of radiation image pickup device according to the invention, illustrating its configuration.

This embodiment is realized by providing the cassette type radiation image pickup device of FIG. 11 with additional radiation shielding members 56. As shown in FIG. 13, the radiation 9 entering the cabinet 14 may get to and become scattered by the bottom of the cabinet 14. Then, the surfaces of the ICs 36 arranged on the printed circuit board 34 may be exposed to radiation 8 depending on the intensity of scattered radiation 8.

In view of this risk, each of the ICs 36 is provided with an additional radiation shielding member 56 to cover the surface of the IC 36 on the printed circuit substrate 34. If any of the ICs 36 are not insulated and protected, an insulating film is preferably arranged between each of the ICs 36 and the corresponding radiation shielding member 56 as in the case of the ICs 35 shown in FIGS. 12 and 12A.

Embodiment 8

Figure 14A:
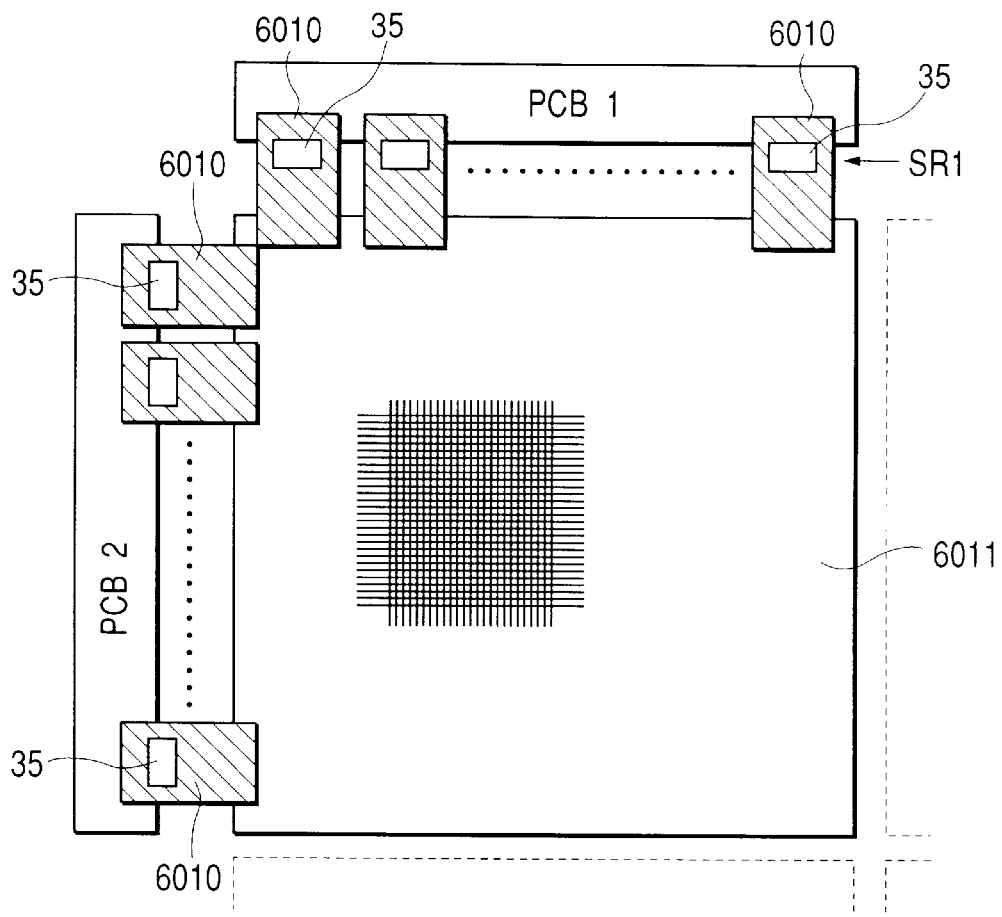
FIGS. 14A and 14B are schematic views of still another embodiment of radiation image pickup device according to the invention, illustrating its configuration.
Figure 14B:
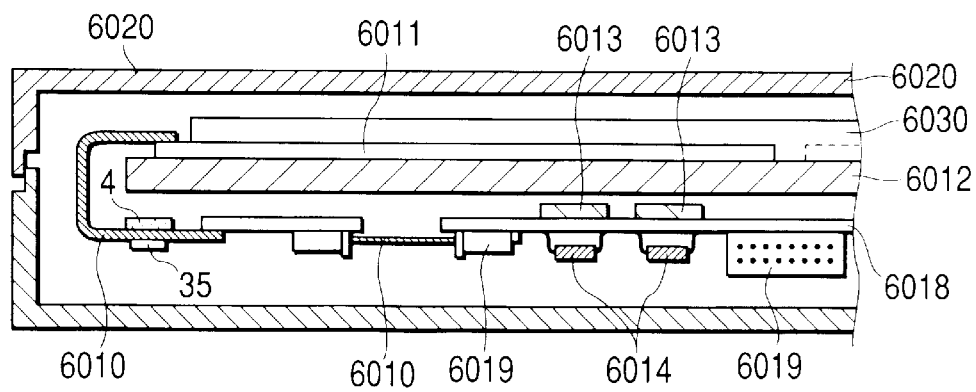

FIGS. 14A and 14B are a schematic plan view and a schematic cross sectional view of the eighth embodiment of radiation image pickup device according to the invention, illustrating its configuration. In this embodiment, a plurality of photoelectric converter elements and a plurality of TFTs are formed in a-Si sensor base members 6011, to which flexible circuit substrates 6010 that are bent by 180° and mounted by ICs 35 operating as shift registers and detector integrated circuits are connected.

Each of the flexible circuit substrates 6010 is connected at the opposite end thereof either to circuit substrate PCB1 or circuit substrate PCB2. A plurality of a-Si sensor base members 6011 are bonded to the base 6012 of a large photoelectric converter, below which lead plates 6013 are arranged as shielding members for protecting semiconductor memories 6014 formed in a processing circuit 6018 from X-rays.

A scintillator 6030 for converting X-rays into rays of visible light typically made of CsI is formed on the a-Si sensor base members 6011 typically by evaporation. As shown in FIG. 14B, the entire device is housed in a carbon case 6020.

Now, a radiation image pickup system according to the invention will be described below.

Figure 15:
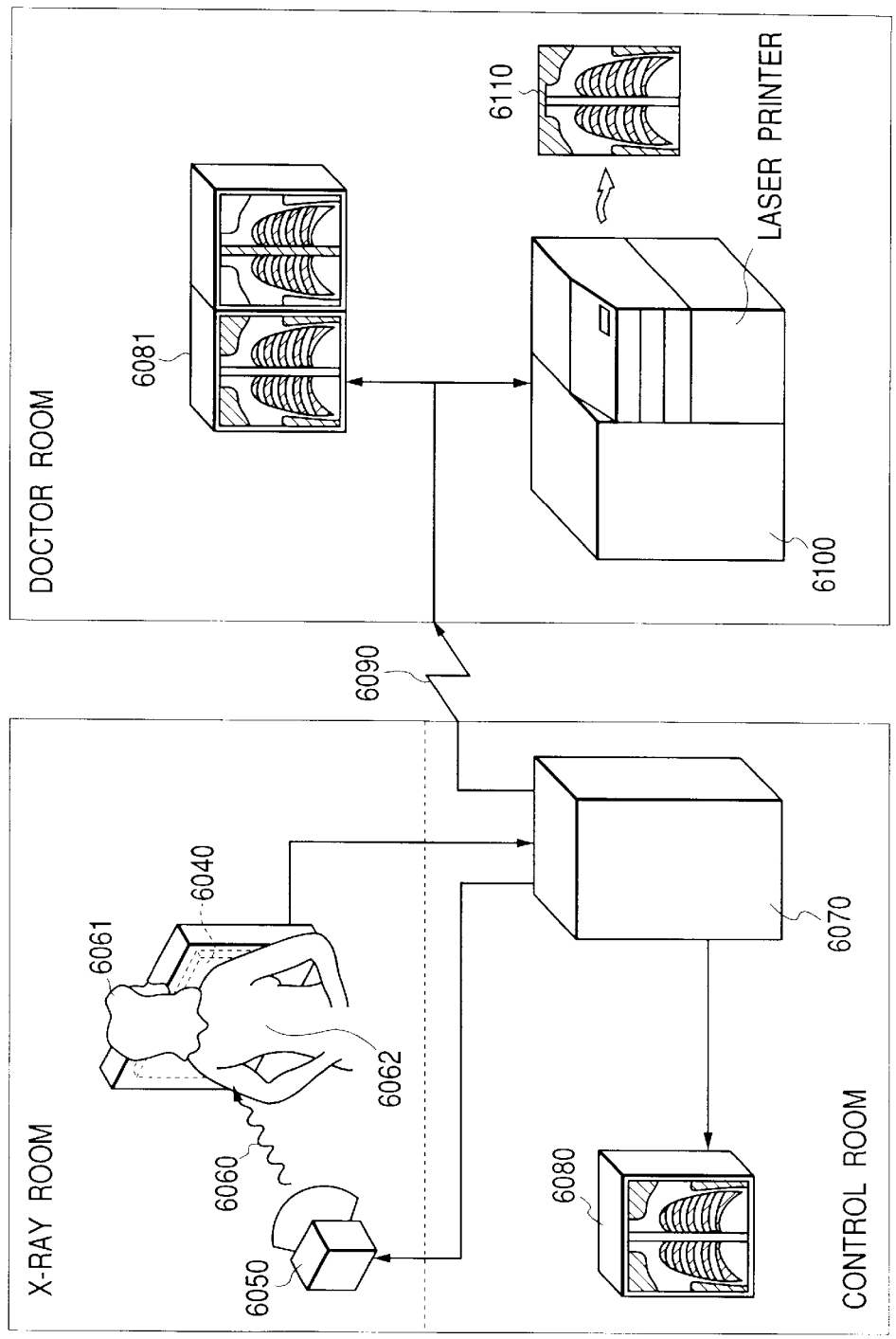
FIG. 15 is a schematic illustration of an X-ray diagnosis system according to the invention.
Figure 16:
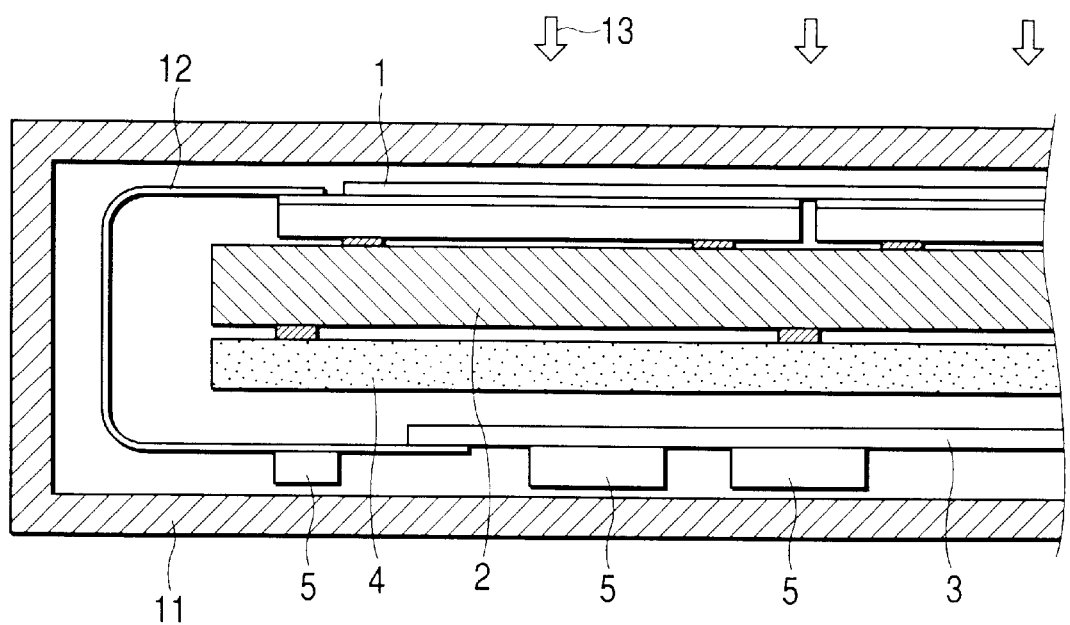
FIG. 16 is a schematic cross sectional view of a known radiation image pickup device.

FIG. 15 is a schematic illustration of an X-ray diagnosis system according to the invention that can be realized by using any of the above described embodiments. The X-rays 6060 generated by X-ray tube 6050 operating as radiation source are transmitted through the chest 6062 of a patient 6061, or a subject, and enter the radiation image pickup device 6040 mounted by a scintillator. The X-rays received by the scintillator contains video information on the inside of the patient 6061.

The scintillator emits light in response to the X-rays striking it and the photoelectric converter element converts the light emitted by the scintillator into an electric signal to obtain the video information. The video information is converted into digital information, which is then processed by an image processor 6070 so that obtained image of the chest of the patient 6061 can be observed on the display screen 6080 in the control room.

The obtained information can be transmitted to a remote site by way of a communication path such as a telephone line 6090 so that the obtained image of the chest may be displayed on the display screen 6081 in the doctors room and/or stored in an optical disk at the remote site. Then, the doctor at the remote site may observe the image for the purpose of diagnosis. Additionally, the obtained image may be recorded on a film 6110 by means of a film processor 6100.

While X-rays are used in the above description of the embodiments, they may be replaced by α-rays, β-rays or γ-rays. Light waves with the wavelength range that can be detected by the photoelectric converter element are electromagnetic waves and include those of visible light. Furthermore, the present invention can be applied to an electromagnetic wave/electric signal converter adapted to convert electromagnetic waves including radiation into electric signals.

What is claimed is:

1. A radiation image pickup device comprising:
    an image pickup element for converting radiation into an electric signal and picking up an image of an object;
    a circuit substrate electrically connected to said image pickup element and provided with at least either a circuit for controlling said input signal to said image pickup element or a circuit for processing said output signal from the image pickup element;
    active elements arranged on the circuit substrate and constituting said circuit; and
    radiation shielding members for shielding said active elements from radiation;
    said radiation shielding members having a combined surface area smaller than a surface area of said circuit substrate and greater than a combined surface area of the active elements.

2. A radiation image pickup device according to claim 1, wherein
    said radiation shielding members include flat members, each of which is adapted to be commonly used for a plurality of active elements.

3. A radiation image pickup device according to claim 1, wherein
    said radiation shielding members include flat members, each of which is adapted to be used only for a semiconductor integrated circuit element operating as an active element and has a surface area greater than the corresponding semiconductor integrated circuit element.

4. A radiation image pickup device according to claim 1, wherein
    said radiation shielding members include flat members, each of which is adapted to be used only for a semiconductor integrated circuit element operating as an active element and has a surface area equal to or greater than the package of the corresponding semiconductor integrated circuit element.

5. A radiation image pickup device according to claim 1, wherein
    said radiation shielding members include flat members, each of which is adapted to be used only for a semiconductor integrated circuit element operating as an active element and has a surface area smaller than the package of the corresponding semiconductor integrated circuit element but greater than the semiconductor chip of the semiconductor integrated circuit element.

6. A radiation image pickup device according to claim 1, wherein
    said radiation shielding members are arranged in contact with said circuit substrate.

7. A radiation image pickup device according to claim 1, wherein
    said radiation shielding members are arranged on the side of said circuit substrate opposite to the side where said active elements are mounted.

8. A radiation image pickup device according to claim 1, wherein
    said radiation shielding members are arranged on the side of said circuit substrate where said active elements are mounted.

9. A radiation image pickup device according to claim 1, wherein
    said radiation shielding members are formed by means of a solder applied to said circuit substrate.

10. A radiation image pickup device according to claim 1, wherein
said image pickup element is provided with a scintillator adapted to emit a visible light upon receiving radiation and an photoelectric converter adapted to generate an electric signal upon receiving said visible light.

11. A radiation image pickup device according to claim 1, wherein
said image pickup element is provided with a converter adapted to generate an electric signal upon receiving radiation.

12. A radiation image pickup device according to claim 1, wherein
said radiation shielding members are so designed as to have a thickness sufficient for blocking the radiation attenuated when transmitted through said image pickup element.

13. A radiation image pickup device according to claim 1, wherein said radiation shielding members contain at least a metal selected from Pb, Ta, Ba and W or an alloy of any of them.

14. A radiation image pickup device according to claim 1, wherein said radiation shielding members contain a plurality of solder balls.

15. A radiation image pickup device according to claim 1, wherein said radiation shielding members are made of hardened organic resin containing at least a metal selected from Pb, Ta, Ba and W.

16. A radiation image pickup device according to claim 1, wherein said radiation shielding members contain powder of a material effective for blocking radiation.

17. A radiation image pickup device comprising:
an image pickup element for converting radiation into an electric signal and picking up an image of an object;
a circuit substrate electrically connected to said image pickup element and provided with at least either a circuit for controlling the input signal to the image pickup element or a circuit for processing the output signal from the image pickup element;
semiconductor integrated circuit elements arranged on said circuit substrate to constitute said circuit; and
radiation shielding members for shielding said semiconductor integrated circuit elements from radiation;
each of said radiation shielding members being adapted to be used only for a semiconductor integrated circuit element and having a surface area smaller than the package of the corresponding semiconductor integrated circuit element but greater than the semiconductor chip of the semiconductor integrated circuit element.

18. A radiation image pickup system comprising a radiation image pickup device according to claim 1 or 17 and a display for displaying the image pickup device.

19. A radiation image pickup device comprising:
an image pickup element for converting radiation into an electric signal and picking up an image of an object;
a circuit substrate electrically connected to said image pickup element and provided with at least either a circuit for controlling said input signal to said image pickup element or a circuit for processing said output signal from the image pickup element;
active elements arranged on the circuit substrate and constituting said circuit; and
radiation shielding members for shielding said active elements from radiation;
wherein said radiation shielding members have a surface area smaller than that of said circuit substrate, and
wherein said radiation shielding members are arranged between said circuit substrate and said image pickup element and are separable from said circuit substrate.

* * * * *

UNITED STATES PATENT AND TRADEMARK OFFICE
CERTIFICATE OF CORRECTION

PATENT NO. : 6,667,480 B2
APPLICATION NO. : 09/897037
DATED : December 23, 2003
INVENTOR(S) : Kenji Kajiwara et al.

It is certified that error appears in the above-identified patent and that said Letters Patent is hereby corrected as shown below:

COLUMN 1
Line 10, "medial" should read --medical--.

COLUMN 5
Line 67, "is made" should read --are made--.

COLUMN 7
Line 46, "the both" should read --both--.

COLUMN 10
Line 19, "lead" should read --led--.

COLUMN 15
Line 5, "an photoelectric" should read --a photoelectric--.

Signed and Sealed this

Fourteenth Day of November, 2006

JON W. DUDAS
*Director of the United States Patent and Trademark Office*